United States Patent [19]

Namizaki et al.

[11] Patent Number: 4,561,096
[45] Date of Patent: Dec. 24, 1985

[54] BURIED SEMICONDUCTOR LASER AVOIDING THYRISTOR ACTION

[75] Inventors: Hirofumi Namizaki; Ryoichi Hirano; Hideyo Higuchi; Etsuji Oomura; Yasushi Sakakibara; Wataru Susaki, all of Hyogo, Japan

[73] Assignee: Mitsubishi Denki Kabushiki Kaisha, Tokyo, Japan

[21] Appl. No.: 506,261

[22] Filed: Jun. 21, 1983

[30] Foreign Application Priority Data

Jun. 21, 1982 [JP] Japan ................. 57-108201

[51] Int. Cl.[4] .............................. H01S 3/19
[52] U.S. Cl. ..................... 372/46; 357/17; 372/48
[58] Field of Search ............ 372/44, 45, 46, 48; 357/17

[56] References Cited

FOREIGN PATENT DOCUMENTS 0045089 4/1981 Japan ................................ 372/46

OTHER PUBLICATIONS

Hanamitsu et al., "A New (AlGa)As Buried Convex Waveguide Structure Laser with a Truncated Convex Active Region", Topical Meeting on Integrated and Guided Wave Optics, Pacific Grove Ca., USA, Jan. 6–8, 1982, FC3-1-4.

Ishikawa et al., "V-Grooved Substrate Buried Heterostructure InGaAsP/InP Laser by One-Step Epitaxy", J. Appl. Phys. 53 (4), Apr. 1982, pp. 2851–2853.

Primary Examiner—James W. Davie
Attorney, Agent, or Firm—Sughrue, Mion, Zinn, Macpeak & Seas

[57] ABSTRACT

In order to prevent the output characteristic of a semiconductor laser from being saturated at higher temperatures due to the thyristor effect of a combination of the semiconductor layers thereof, an intermediate layer of a conductivity type the same as that of the substrate and opposite that of the first semiconductor layer is provided between the substrate and the first layer. Due to the relatively low carrier density of the intermediate layer, oscillation can be stably carried out even at higher temperatures without triggering the thyristor structure.

6 Claims, 7 Drawing Figures

BURIED SEMICONDUCTOR LASER AVOIDING THYRISTOR ACTION

BACKGROUND OF THE INVENTION

This invention relates to semiconductor laser devices, and more particularly to a semiconductor laser device which is low in threshold value and has an excellent temperature characteristic.

A variety of semiconductor laser devices of different structures have been known in the art. BC (buried crescent) type semiconductor laser devices and BH (buried heterostructure) type semiconductor laser devices are particularly known for their oscillation mode stability and low threshold values.

FIG. 1 is a sectional diagram outlining a conventional BC type semiconductor device. In FIG. 1, reference numeral 1 designates an n-InP semiconductor substrate having a first electrode 2 on its second major surface and having a carrier density of about $7 \times 10^8/cm^3$; 3, a first semiconductor layer of p-InP which is formed on the first major surface of the semiconductor substrate by liquid phase epitaxial growth and has a carrier density of approximately $1 \times 10^{18}/cm^3$; 4, a second semiconductor layer of n-InP which is formed on the first semiconductor layer 3 by liquid phase epitaxial growth; 5, a belt-shaped groove etched in from the surface of the second semiconductor layer to the semiconductor substrate 1; and 6, a fifth semiconductor layer of n-InP which is formed on the bottom of the groove 5, namely, the main surface of the substrate, by liquid phase epitaxial growth in such a manner that one portion thereof is in contact with the bottom of the groove 5 and another portion is in contact with the lower portion of the side 3a of the first semiconductor layer 3. A semiconductor layer 6 which is the same as the fifth semiconductor layer is formed on a part of the second semiconductor layer 4 as shown.

Further in FIG. 1, reference numeral 7 designates an active layer of n-InGaAsP of crescent section which is formed on the fifth semiconductor layer 6 in the groove 5 by liquid phase epitaxial growth in a manner such that both ends thereof are in contact with the side walls 3a of the first semiconductor layer 3. The active layer 7 is smaller in band gap than InP, forming a so-called double heterojunction. At the same time the active layer 7 is formed, an InGaAsP layer 8 is formed on the remaining parts of the fifth semiconductor 6. The active layer 7 may be of p-InGaAsP. Reference numeral 9 designates a third semiconductor layer of p-InP which is formed on the second semiconductor layer 4 and the InGaAsP layer 8 and on the active layer 7 in a manner such that it is in contact with the upper portions of the side 3a of the first semiconductor layer 3 and the side walls 4a of the second semiconductor layer 4. A second electrode 10 is formed on the major surface of the third semiconductor layer 9.

In FIG. 2 showing a BH semiconductor device, reference numeral 1 designates a semiconductor substrate of n-InP; 7, an active layer of n- or p-InGaAsP which is formed on a first major surface of the semiconductor substrate 1; 9, a third semiconductor layer of p-InP which is formed on the active layer 7 by liquid phase epitaxial growth; the upper portion of the substrate 1, the active layer 7 and the third semiconductor layer 9 being etched on either side so as to form a belt-shaped protrusion; and 3, first semiconductor layers of p-InP formed on both sides of the belt-shaped protrusion by liquid phase epitaxial growth in a manner such that the sides of the active layer 7 are in contact with inner sides 3a of the first semiconductor layers. Further in FIG. 2, reference numeral 4 designates second semiconductor layers of n-InP formed on the first semiconductor layers 3; 11, sixth semiconductor layers of p-InP formed on the second semiconductor layers 3; and 10, a second electrode formed on the third and sixth semiconductor layers 9 and 11.

In both the BC type semiconductor laser device and the BH type semiconductor laser device, current flows as described below. FIG. 3 shows the device of FIGS. 1 or 2 in the form of a model. The flow of current will be described with reference to FIG. 3.

The device is structurally designed so that, in order to improve the laser oscillation efficiency, current is caused to collectively flow in the active region 7, which generally has a small width, approximately 2 μm, in view of oscillation mode control. In other words, the structure of the device is such that the second semiconductor layers 4 of a first conductivity type are provided in a second conductivity type layer consisting of the first and third semiconductor layers 3 and 9 (or the first, third and sixth semiconductor layers 3, 9 and 11 in FIG. 2), thus forming a so-called slit. Because of this structure, the second semiconductor layers 4 in the second conductivity type layers serve as an energy barrier against holes, which are charge carriers in the second conductivity type layers. Accordingly, under normal conditions, current cannot flow over the second semiconductor layers. That is, the second semiconductor layers 4 serve as a slit for reducing the amount of current, so that the current is caused to flow collectively in a small width of the active layer 7.

In the device thus constructed, a p-n junction 12 of InP is unavoidably formed between the semiconductor substrate 1 and possibly the fifth semiconductor layer 6 and on one side the first semiconductor layer 3 on the other side. Accordingly, the structure is such that a p-n-p-n layer consisting of the third semiconductor layer 9 (or the sixth semiconductor layers 11) of the second conductivity type, the second semiconductor layers 4 of the first conductivity type, the first semiconductor layers 3 of the second conductivity type and the semiconductor substrate 1 of the first conductivity type in the stated order from above is formed near the active layer 7. This structure is considerably similar to that of a thyristor. In the semiconductor substrate 1, the amount of added impurities is relatively large in order to decrease its defect density, and in general the carrier density is approximately $7 \times 10^{18}/cm^3$. In the first semiconductor layer 3, the carrier density is, in general, low, not more than $2 \times 10^{18}/cm^3$ ($1 \times 10^{18}/cm^3$ in the prior art), because the layer 3 is formed by liquid phase epitaxial growth. Therefore, the device is readily turned on as a thyristor due to a leakage current Ig as shown in FIG. 3.

The structure shown in FIG. 3 can be represented by the electrical equivalent circuit of FIG. 4. When the current $I_D$ flowing in the active layer 7 is small, the leakage current Ig is also small, and therefore the thyristor structure is not turned on or energized and the applied current effectively contributes to oscillation. When the temperature rises, the amount of current required for oscillation is increased and the applied current must be increased. However, if the leakage current Ig is also increased, the thyristor structure is turned on and a larger inactive current $I_S$ flows. Thus, the current $I_D$ in the active layer 7 is so small that the oscillation is ineffective and unstable.

FIG. 5 is a graphical representation showing the relationships between the current flowing between the first and second electrodes 2 and 10 and the output of the laser device with the ambient temperature changed. As is apparent from FIG. 5, at low temperatures the current contributes effectively to the laser output; however, at high temperatures the current vs Laser output characteristic exhibits saturation, so that the current does not effectively contribute to the laser output, and at worst the oscillation is stopped.

SUMMARY OF THE INVENTION

In view of the foregoing, an object of this invention is to provide a semiconductor laser device with a narrow active region providing a low threshold value in which fourth semiconductor layers of a first conductivity type, which are lower in carrier density than first semiconductor layers of a second conductivity type, are formed between a semiconductor substrate of the first conductivity type and the first semiconductor layers which are in contact with the active layer, whereby oscillation is stably carried out even at high temperatures.

DETAILED DESCRIPTION OF THE PREFERRED EMBODIMENTS

Figure 1:
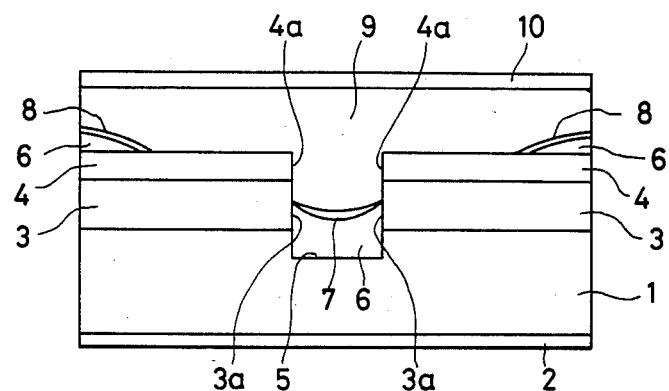
FIG. 1 is a sectional view outlining the structure of a conventional BC type semiconductor laser device.

A first example of a semiconductor layer device according to this invention will now be described with reference to FIG. 6. A specific feature of this example resides in that fourth semiconductor layers 13 of a first conductivity type are formed between a semiconductor substrate 1 of the first conductivity type and a first semiconductor layer 3 of a second conductivity type, when compared with that of the conventional device in FIG. 1. The fourth semiconductor layers 13 are smaller in carrier density than the first semiconductor layer 3, and is of n-InP.

Therefore, the thyristor structure, or p-n-p-n layer, which is made up of the third semiconductor layer 9, the second semiconductor layers 4, the first semiconductor layers 3, the fourth semiconductor layers 13 and the semiconductor substrate 1 near the active layer 7, will not be turned on to allow the inactive current $I_S$ to flow at either low or high temperatures. Thus, an effective and stable laser output is provided with the aid of the current flowing between the first and second electrodes 2 and 10. The reason for this is as follows: As the carrier density of the fourth semiconductor layers 13 is lower than that of the first semiconductor layers 3 confronted therewith, the number of electrons injected into the first semiconductor layers 3 by the leakage current $I_g$ is small. Furthermore, as the injected electrons combine with holes in the first semiconductor layers 3, they scarcely flow to the second semiconductor layers 4, thus not lowering the energy barrier of the second semiconductor layers 4.

One specific example of the device according to the invention will now be described.

Figure 4:
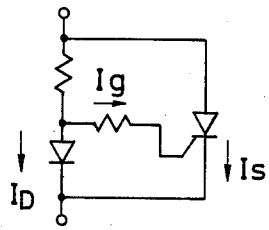
FIG. 4 is an electrical equivalent circuit of the device in FIG. 3.
Figure 5:
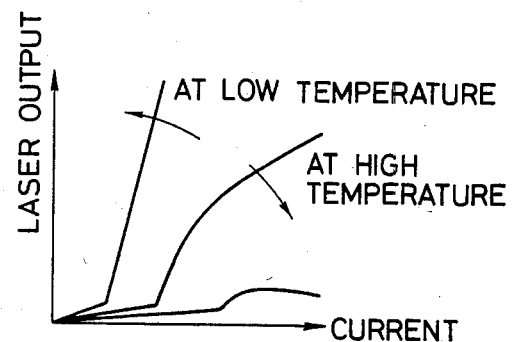
FIG. 5 is a graphical representation indicating the current vs. laser output characteristic of the devices of FIGS. 1 or 2.

In this example, the semiconductor substrate 1 had a carrier density of $7 \times 10^{18}/cm^3$, the fourth semiconductor layers 13 had a carrier density of $2 \times 10^{17}/cm^3$, the first semiconductor layers 3 had a carrier density of $1 \times 10^{18}/cm^3$ and a thickness of 1.8 $\mu$m, the second semiconductor layers 4 had a carrier density of $2 \times 10^{18}/cm^3$ and a thickness of 0.7 $\mu$m, the third semiconductor layer 9 had a carrier density of $8 \times 10^{17}/cm^3$, and the active layer 7 a width of 2 $\mu$m. The current vs. laser output characteristic of the device was measured with the ambient temperature (heat sink temperature) varied. In this measurement, the characteristic did not become saturated until the ambient temperature reached 80° C. Thus, laser oscillation was stable. Calculations according to the electrical equivalent circuit of FIG. 4 under the above-described conditions have proved that, when the current $I_D$ flowing in the active region 7 is 100 mA, the leakage current $I_g$, being approximately 10 mA, scarcely affects the oscillation characteristic. This is well in agreement with the above-described experimental results.

Figure 6:
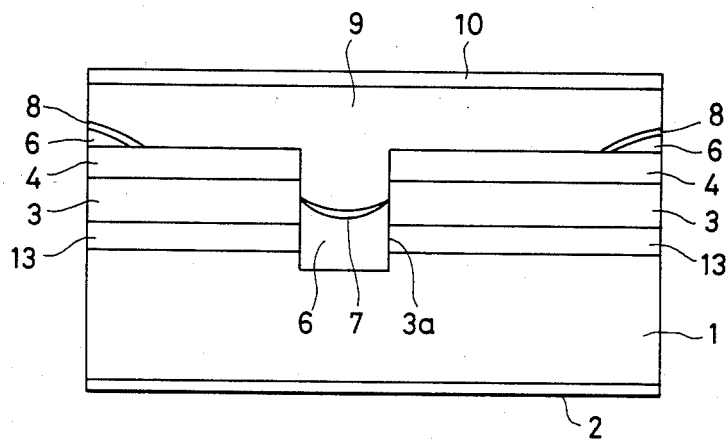
FIG. 6 is a sectional view outlining the structure of one example of a semiconductor laser device according to this invention.

The present inventors have conducted intensive research including forming a number of semiconductor laser devices having the structure shown in FIG. 6. As a result, it has been found that when, under conditions such as in the conventional device where the second semiconductor layers 4 have a thickness of 0.5 $\mu$m, the first semiconductor layers 3 a thickness of 1.5 $\mu$m, the second semiconductor layers 4 a carrier density of $2 \times 10^{18}/cm^3$ and the third semiconductor layer 9 a carrier density of $8 \times 10^{17}/cm^3$; and when the carrier densities of the first and fourth semiconductor layers 3 and 13 are set to $5 \times 10^{17}/cm^3$, or more and less than $5 \times 10^{17}/cm^3$, respectively, no large leakage current flows and the current vs. laser output characteristic is not saturated.

Figure 2:
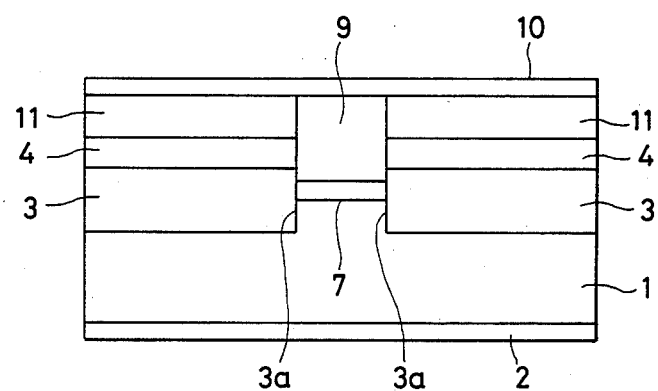
FIG. 2 is a sectional view outlining the structure of a conventional BH type semiconductor laser device.
Figure 3:
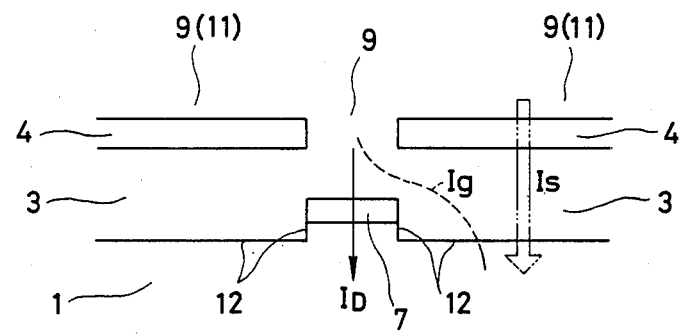
FIG. 3 is a diagram showing the devices of Figs. 1 or 2 in the form of a model.
Figure 7:
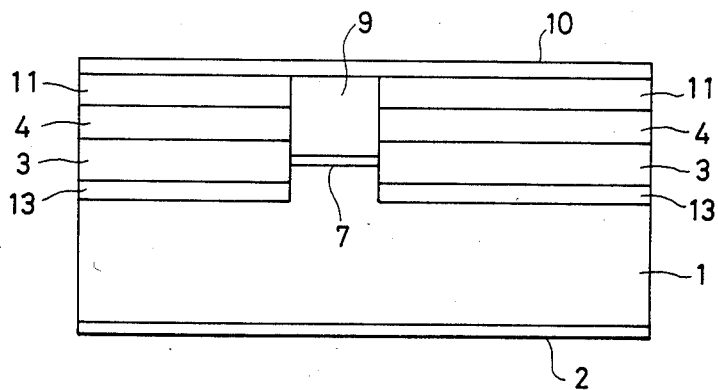
FIG. 7 is a sectional view outlining the structure of another example of the device according to the invention.

FIG. 7 shows a second example of the device according to the invention. The second example can be obtained by modifying the BH type semiconductor laser device of FIG. 2 as follows: Fourth semiconductor layers 13 of the first conductivity type, which are lower in carrier density than the first semiconductor layers 3, are formed between the semiconductor substrate 1 and the first semiconductor layers 3.

The device thus constructed provides stable laser oscillation even at high temperatures, similarly as in the first example shown in FIG. 6.

The invention has been described with reference to examples in which the material of the semiconductor substrate 1 and the first through sixth semiconductor layers 2, 4, 9, 13, 6 and 11 was InP and that of the active layer 7 was InGaAsP; however, it should be noted that the invention is not limited thereto or thereby. That is, semiconductor laser devices employing groups III–V compounds can provide the same effects.

As is apparent from the above description, according to the invention, in a semiconductor device having a narrow active region, fourth semiconductor layers of a first conductivity type, which are lower in carrier density than adjacent first semiconductor layers of a second conductivity type, are formed between a semiconductor substrate of the first conductivity type and the first semiconductor layers, to which the active region is adjacent. Therefore, the device can provide stable laser oscillation even at high temperatures.

What is claimed is:

1. A semiconductor laser device, comprising:
   a semiconductor substrate of a first conductivity type;
   a first semiconductor layer of a second conductivity type formed on said seminconductor substrate;
   an active layer of said first or second conductivity type formed in contact with parts of sides of said first semiconductor layer, said active layer having a relatively narrow band gap;
   resonant cavity means bounding said active region;
   a second semiconductor layer of said first conductivity type formed on said first semiconductor layer;
   a third semiconductor layer formed at least on said active layer in contact with parts of said sides of said first semiconductor layer and sides of said second semiconductor layer,
   electrode means connected to said substrate and said third semiconductor layer, and
   a fourth semiconductor layer of said first conductivity type and being lower in carrier concentration than said first semiconductor layer by at least a factor of five and formed between said semiconductor substrate and said first semiconductor layer.

2. A device as claimed in claim 1, wherein said active layer is formed in a groove which penetrates and separates said first and second semiconductor layers into two parts.

3. A device as claimed in claim 1, wherein said first and second semiconductor layers are formed on both sides of said active layer over said semiconductor substrate.

4. A device as claimed in claim 1, wherein said semiconductor substrate is n-InP, said second and fourth semiconductor layers are of n-InP, said first and third semiconductor layers are of p-InP, and said active layer is of one of n-InGaAsP and p-InGaAsP.

5. A device as claimed in claim 1, wherein said fourth seminconductor layer has a carrier density of less than $5 \times 10^{17}/cm^3$.

6. In a semiconductor layer device, comprising;
   a substrate of a first conductivity type,
   first and second semiconductor layers of a second and first conductivity type, respectively, formed on one side of said substrate;
   a region at least partially dividing said first and second layers into two, and
   an active layer within said region and being in contact with inner sides of said first layer;
   the improvement comprising a further semiconductor layer between said substrate and said first semiconductor layer and having a carrier density lower than that of said first semiconductor layer by at least a factor of five.

* * * * *